(12) United States Patent
Jeong (10) Patent No.: US 6,251,790 B1
(45) Date of Patent: Jun. 26, 2001

(54) METHOD FOR FABRICATING CONTACTS IN A SEMICONDUCTOR DEVICE

(75) Inventor: In-Kwon Jeong, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/351,083

(22) Filed: Jul. 9, 1999

(30) Foreign Application Priority Data

Jul. 10, 1998 (KR) .................................................. 98-27888

(51) Int. Cl.$^7$ .................................................. H01L 21/44
(52) U.S. Cl. ........................................... 438/697; 438/694
(58) Field of Search ..................................... 438/689, 694, 438/695, 696, 697; 437/190, 192, 194, 195

(56) References Cited

U.S. PATENT DOCUMENTS

| | | | |
|---|---|---|---|
| 5,534,462 | * | 7/1996 | Fiordalice et al. .................. 437/190 |
| 6,001,660 | * | 12/1999 | Park et al. ............................... 438/3 |
| 6,027,966 | * | 2/2000 | Saenger et al. ...................... 438/239 |

* cited by examiner

Primary Examiner—Hoanganh Le
Assistant Examiner—Hoang Nguyen
(74) Attorney, Agent, or Firm—Cantor Colburn LLP

(57) ABSTRACT

A contact structure between two conductors in a semiconductor device and a method for fabricating the same which can increase alignment margins between the contact plug and overlying conductor are provided. The contact plug includes a lower conductor formed on a semiconductor substrate, an insulating layer formed on the lower conductor and on the semiconductor substrate, the insulating layer having a contact hole, a contact plug recess a predetermined depth from a top surface of the insulating layer in the contact hole, and a sidewall spacer formed on both lateral sidewalls of remainder of the contact hole. The contact plug structure is made by a process of forming a recessed contact plug in the contact hole formed in an insulating layer. Sidewall spacer is formed on both sidewalls of the remainder of the contact hole that has low aspect ratio as compared to that of the contact hole prior to the formation of the recessed contact plug. The resulting sidewall spacer can have good deposition profile and serves to reduce critical dimension of the contact hole.

15 Claims, 7 Drawing Sheets

METHOD FOR FABRICATING CONTACTS IN A SEMICONDUCTOR DEVICE

FIELD OF THE INVENTION

The present invention relates to a contact structure and a method for fabricating thereof, and more particularly relates to a contact structure including a recessed contact plug in a contact hole and a sidewall spacer formed on both sidewalls of the remainder of the contact hole and a method for fabricating thereof.

BACKGROUND OF THE INVENTION

A connection between a conductive region of an impurity diffused layer in a semiconductor substrate or a lower level wiring and an upper level wiring layer through a contact hole formed in an interlayer insulating film is one of the more important fabrication techniques in a semiconductor device. As the degree of the integration density of integrated circuit device increases, contact openings formed in the insulating layer are required to have a small opening size to ensure a high density device. In order to increase alignment margins between contact openings and overlying conductors, it is necessary that the critical dimension of the contact openings be reduced.

Figure 1A:
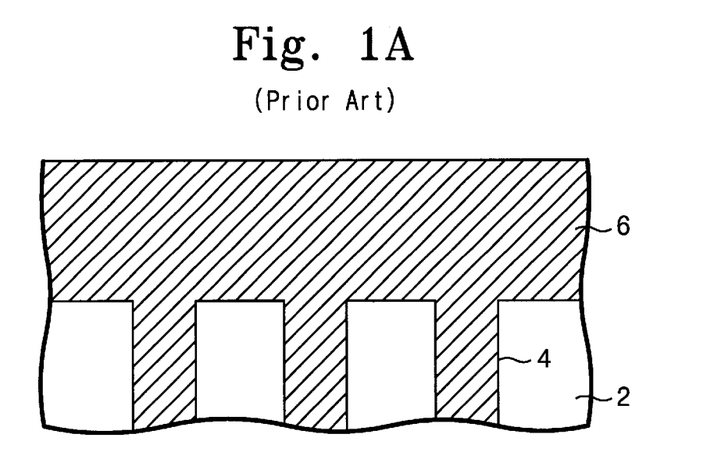
FIGS. 1A and 1B schematically show cross-sectional views of a method for fabricating a storage node according to a conventional method.
Figure 1B:
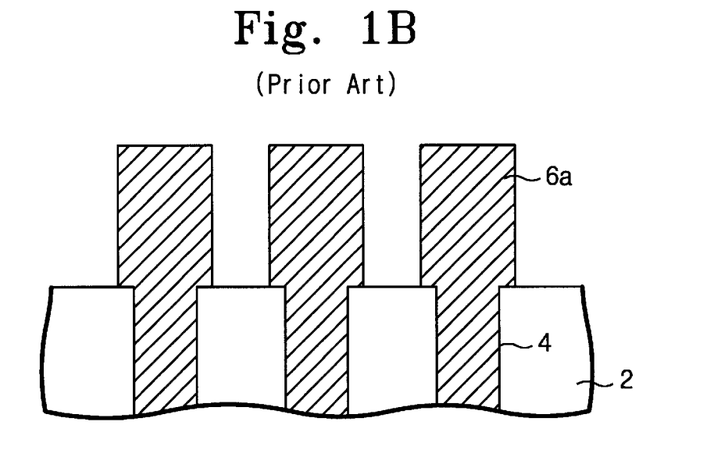
Figure 2:
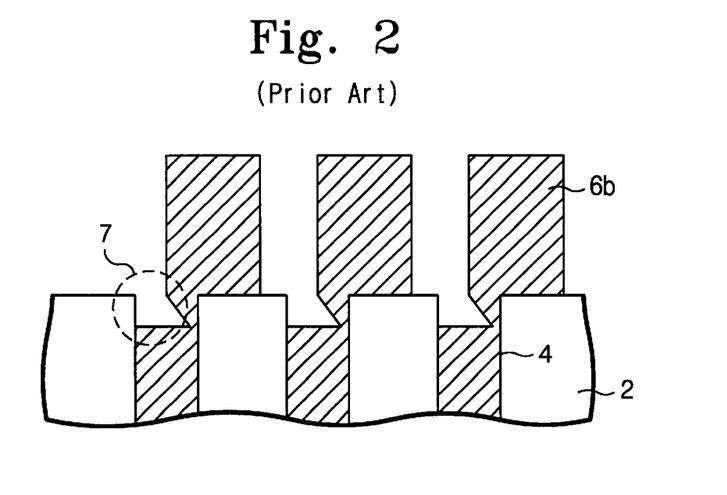
FIG. 2 is a cross-sectional view of a storage node in case of misalignment.

A conventional method for forming a contact in a semiconductor device is schematically illustrated in FIGS. 1A and 1B. Referring to FIG. 1A, an insulating layer 2 is formed on a semiconductor substrate (not shown). The insulating layer 2 is etched to form contact holes 4 that expose conductive regions of a semiconductor substrate. A conductive material 6 such as doped polysilicon as for a storage node is deposited on the resulting structure. Through conventional photolithographic process, the polysilicon layer 6 between the contact holes 4 is etched to form storage nodes 6a that are electrically connected to conductive region of the semiconductor substrate as shown in FIG. 1B. However, there are some problems with this method. If misalignment occurs during the photolithographic process, the polysilicon may be over-etched at the neck part (see reference numeral 7) of the storage node 6b and in severe case, the storage node 6b may fall down.

Figure 3:
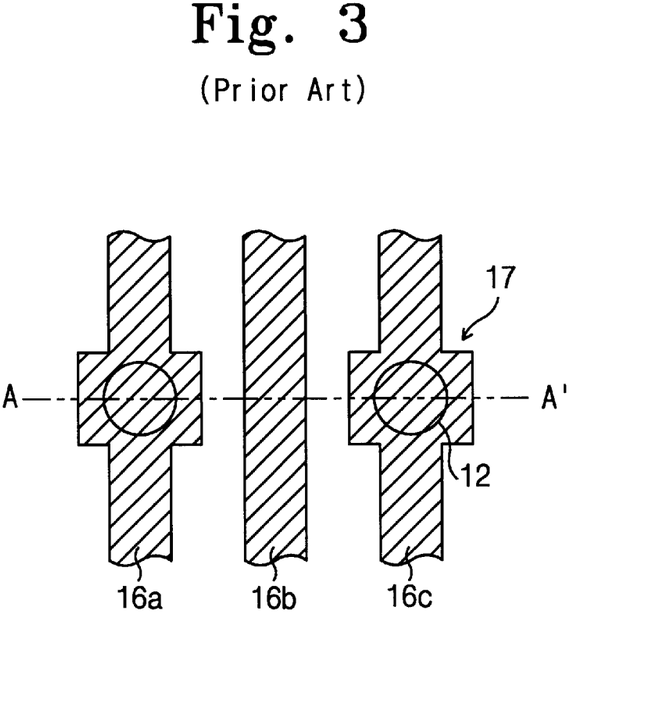
FIG. 3 is a top plan view schematically showing bit line patterns according to a conventional method.
Figure 4:
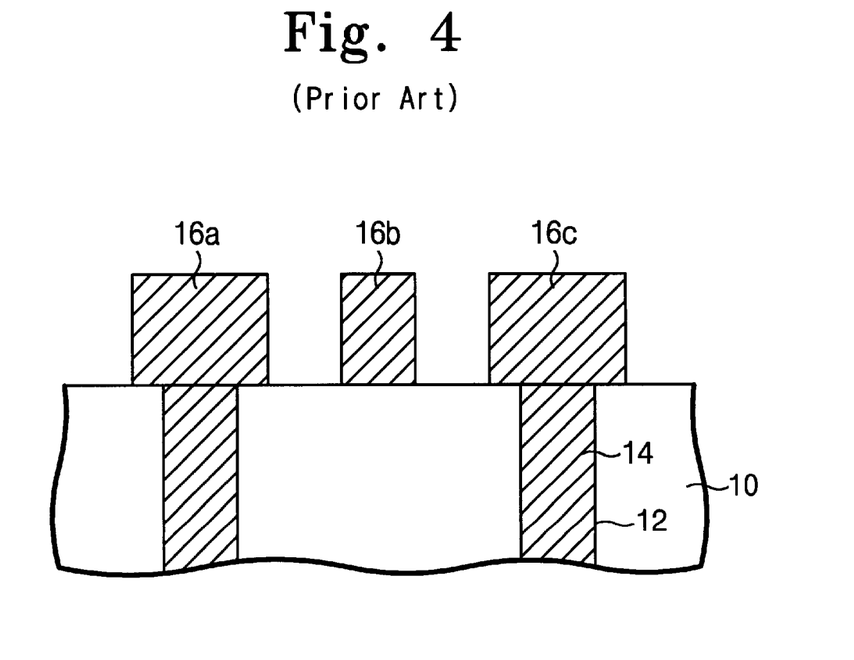
FIG. 4 is a cross-sectional view taken along line A–A' of FIG. 3.

Another conventional contact in a semiconductor device is schematically shown in FIGS. 3 and 4. FIG. 3 schematically shows top plan views of bit line patterns and FIG. 4 is a cross-sectional view of bit line pattern and contact plug taken along line A–A' of FIG. 3. In FIG. 3, in order to increase alignment margins between bit lines 16a and 16c and bit line contacts (see reference number 14 of FIG. 4), portions of the bit line patterns are formed to have enlarged portions (see reference number 17) at regions where contact is to be made. Such enlarged portions 17 may be a serious obstacle to smaller feature size. Also an electrical bridge between adjacent bit line patterns may occur.

SUMMARY OF THE INVENTION

The present invention was made in view of the above problems associated with the prior art, and it is therefore an object of the invention to provide a method for forming contacts in a semiconductor device that increase alignment margins between contact plugs and overlying conductors by reducing critical dimension of the contact holes.

It is another object of the invention to provide a method for forming contacts in a semiconductor device that can prevent storage nodes from falling down due to overetching in case of misalignment.

To achieve this and other advantages and in accordance with the purpose of the present invention, recessed contact plug is formed in a contact hole formed in an insulating layer. A sidewall spacer is further formed in remainder of the contact hole to reduce critical dimension of the contact size. Accordingly, alignment margins to laterformed overlying conductors can be increased. The recessed contact plug decreases the height of the contact hole, i.e., reduces aspect ratio thereof. Accordingly, the sidewall spacer can be formed to have a good deposition profile. Overlying conductors such as storage nodes can be easily formed to be electrically connected to the plugs without defects even in the presence of misalignment.

More specifically, an insulating layer comprising an oxide is formed on a semiconductor substrate. The semiconductor substrate has a conductor region, e.g., impurity diffusion region. A selected portion of the insulating layer is etched to form a contact hole through photolithographic process. The contact hole exposes the conductor region of the semiconductor substrate. A conductive material is deposited in the contact hole and on the insulating layer and then etched back to form a contact plug that is recessed at predetermined depth from a top surface of the insulating layer in the contact hole. Accordingly, the remainder of contact hole has a low aspect ratio thereof as compared to the initial contact hole. The conductive material deposited in the contact hole may include silicon, tungsten, aluminum, titanium, titanium nitride, tungsten nitride, copper, platinum, Au (gold) and Ag (silver).

A sidewall spacer is then formed on both sidewalls of the remainder of contact hole. The spacer can have a good sidewall profile due to reduced height of the contact hole. The sidewall spacer is provided to reduce critical dimension of the contact hole, which allows the formation of small contact hole exceeding the photolithographic resolution and allows increased alignment margins with respect to laterformed conductor pattern. The sidewall spacer is made of a material that has an etching selectivity with respect to the later-formed upper conductor. As an example, material such as tungsten, titanium, silicon and compounds such as silicon oxide (Si—O), silicon oxynitride (Si—O—N), silicon nitride (Si—N), aluminum oxide (Al—O), aluminum nitride (Al—N), boron nitride (B—N), titanium nitride (Ti—N), tungsten silicide (W—Si) and tungsten nitride (W—N).

After that, a conductive material is deposited in the remainder of the contact hole and on the insulating layer and patterned to form the upper conductor. For example, the upper conductor can be a storage node. In this case, polysilicon layer is deposited in the remainder of contact hole and on the insulating layer to a thickness that defines the height of the storage node.

Also, the upper conductor can be a bit line. In this case, there is no need for bit line tap in order to increase alignment margins. Accordingly, spaces between adjacent bit lines can be reduced without electrical bridge therebetween.

Also, after forming the recessed contact plug and sidewall spacer, the remainder of contact hole is deposited with a conductive material and then planarized down to the top surface of the insulating layer. After that, another conductive layer is deposited on the insulating layer and patterned into desired conductor pattern.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

The present invention will now described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present. Moreover, each embodiment described and illustrated herein includes its complementary conductivity type embodiment as well.

Figure 5A:
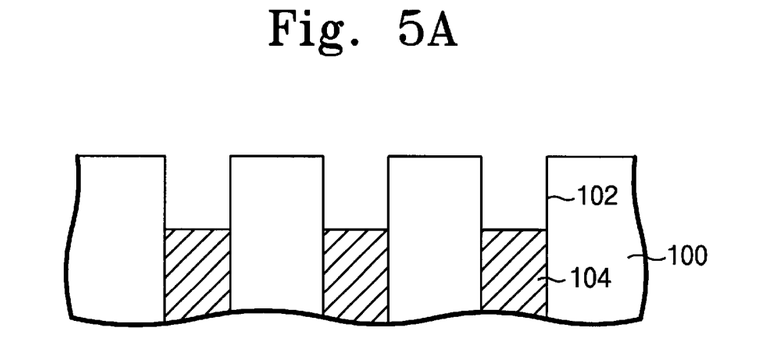
FIGS. 5A to 5D are cross-sectional views of a method for forming a storage node, at selected process steps according to a first embodiment of the present invention.
Figure 5B:
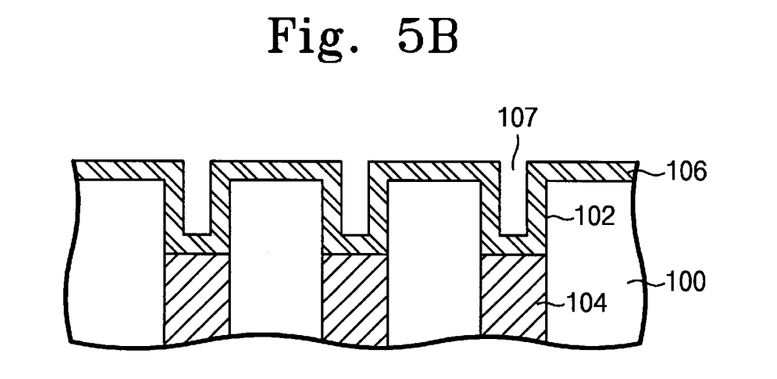
Figure 5C:
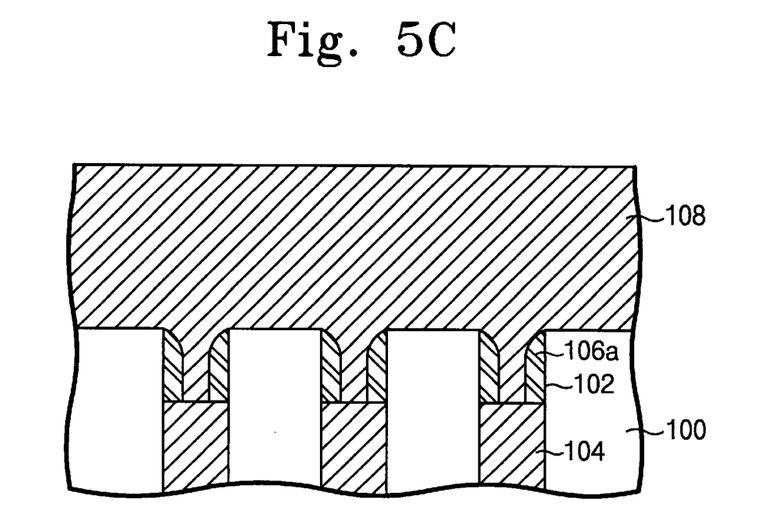
Figure 5D:
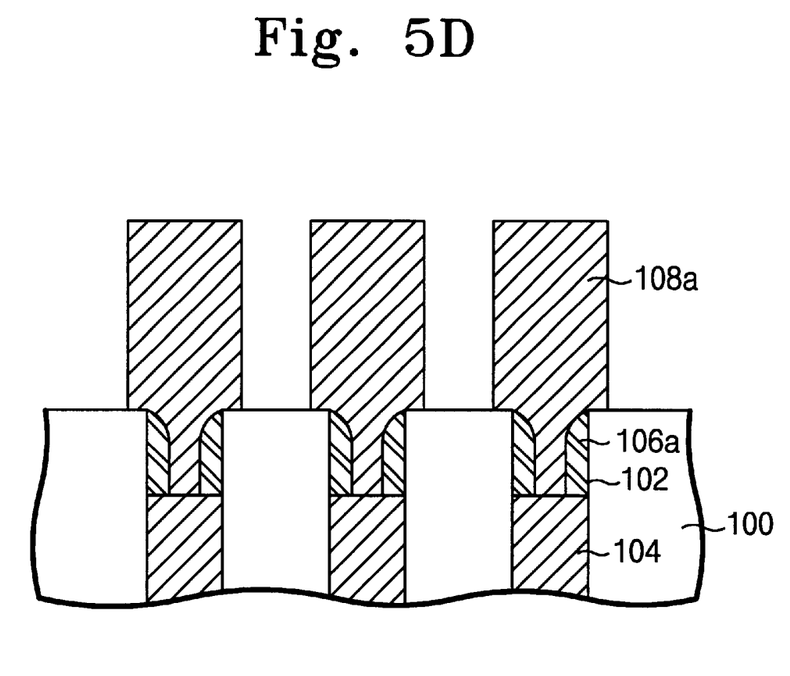

FIG. 5D schematically shows a contact structure for a storage node in accordance with a first embodiment of the present invention. Referring to FIG. 5D, the contact structure includes a recessed contact plug 104 and sidewall spacer 106a in a contact hole 102 that is formed in an insulating layer 100. More specifically, the contact plug 104 is formed in the contact hole 102 recessed a predetermined depth from a top surface of the insulating layer 100. Sidewall spacer 106a is formed on the sidewalls of the remainder of contact hole 102. The sidewall spacer 106a can reduce the critical dimension of the contact hole 102 by the thickness of the sidewall spacer 106a. A conductor, more specifically a storage node 108a, is electrically connected to the recessed contact plug 104 and sidewall spacer 106a. Due to the presence of the sidewall spacer 106a, the alignment margins between the conductor 108a and the contact plug 104 can be increased. The sidewall spacer 106a can be made of an insulating material or conductive material that has an etching selectivity with respect to the later-formed conductive material 108.

Formation of above mentioned contact structure will now be described with reference to FIGS. 5A to 5D. Referring now to FIG. 5A, an insulating layer 100 is formed on a semiconductor substrate (not shown). The semiconductor substrate has conductor regions, e.g., impurity diffusion regions. The insulating layer 100 can be made of an oxide layer. Selected portions of the insulting layer 100 are etched through photolithographic process to form contact holes 102 that expose impurity diffusion regions.

The next process sequence is to form the recessed contact plugs 104. First, a conductive material such as silicon, tungsten, aluminum, titanium, titanium nitride, tungsten nitride, copper, platinum, Au (gold) and Ag (silver) is deposited in the contact holes 102 and on the insulating layer 100. Etch back process by dry or wet etching is performed to form the contact plugs 104 that are recessed at predetermined depth form the top surface of the insulating layer 100 in the contact holes 102. Alternatively, the conductive material is first planarized by CMP(chemical mechanical polishing) and then over-etching is performed to form the recessed contact plugs 104.

Referring to now to FIG. 5B, a material layer 106 for spacer formation is deposited in the remainder of contact hole and on the insulating layer 100. The material layer 106 is made of a material that has an etching selectivity with respect to the later-formed conductive material 108. As an example, tungsten, titanium, silicon and compounds such as silicon oxide (Si—O), silicon oxynitride (Si—O—N), silicon nitride (Si—N), aluminum oxide (Al—O), aluminum nitride (Al—N), boron nitride (B—N), titanium nitride (Ti—N), tungsten silicide (W—Si) and tungsten nitride (W—N) can be employed. The material layer 106 is formed to a thickness to form at least an opening 107 in the remainder of contact hole 102. For example, if the size of the contact hole 102 is about 2 nm to 400 nm, the thickness of the material layer 106 can be about less than 1 nm to 200 nm. The depth of the recessed portion by the contact plug 104 from the top surface of the insulating layer 100 is at least the same thickness of the material layer 106.

The material layer is then etched backed to form sidewall spacers 106a on both sidewalls of the remainder of contact hole 102, as shown in FIG. 5C.

Conductive material 108 for storage node such as polysilicon is then deposited on the resulting structure. Through conventional photolithographic process, selected portions of deposited polysilicon 108 are etched to form storage nodes 108a that are electrically connected to the recessed contact plug 104 and sidewall spacer 106a.

Figure 6:
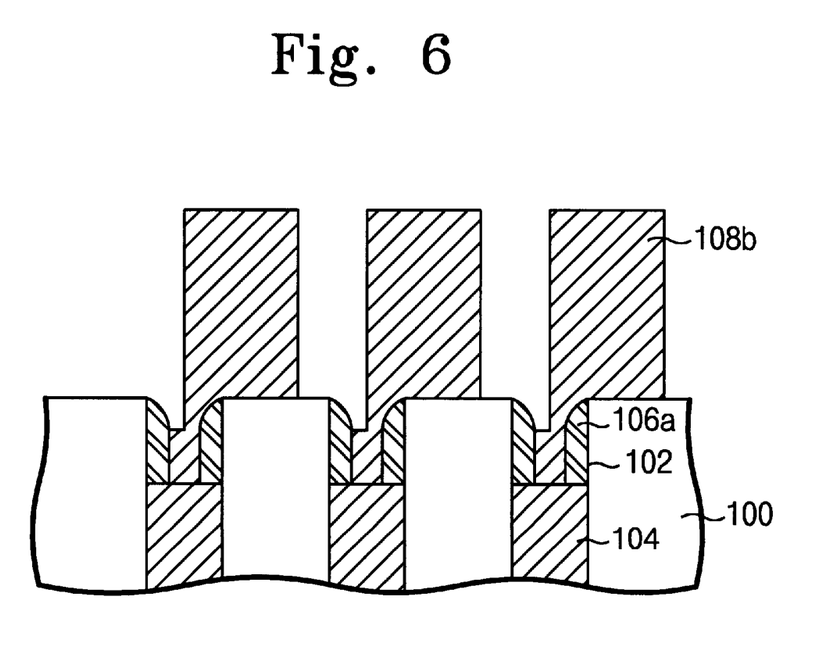
FIG. 6 is a cross-sectional view of a storage node in case of misalignment according to the first embodiment of the present invention.

Even if misalignment can occur in this photolithographic process as shown in FIG. 6, reliable storage node 108b can be formed since the sidewall spacer 106a increases alignment margins. Moreover, the sidewall spacer 106a can be used as an etching stopper during the step of etching the polysilicon layer 108.

Figure 7:
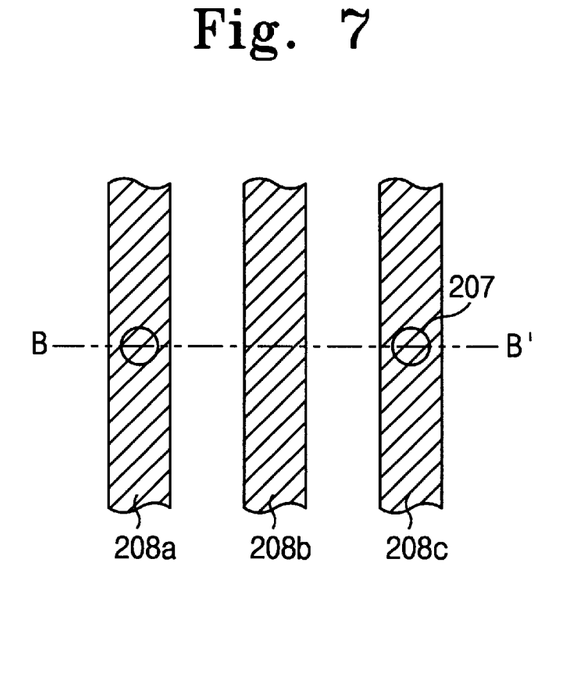
FIG. 7 schematically shows a top plan view of bit line according to the first embodiment of the present invention.
Figure 8:
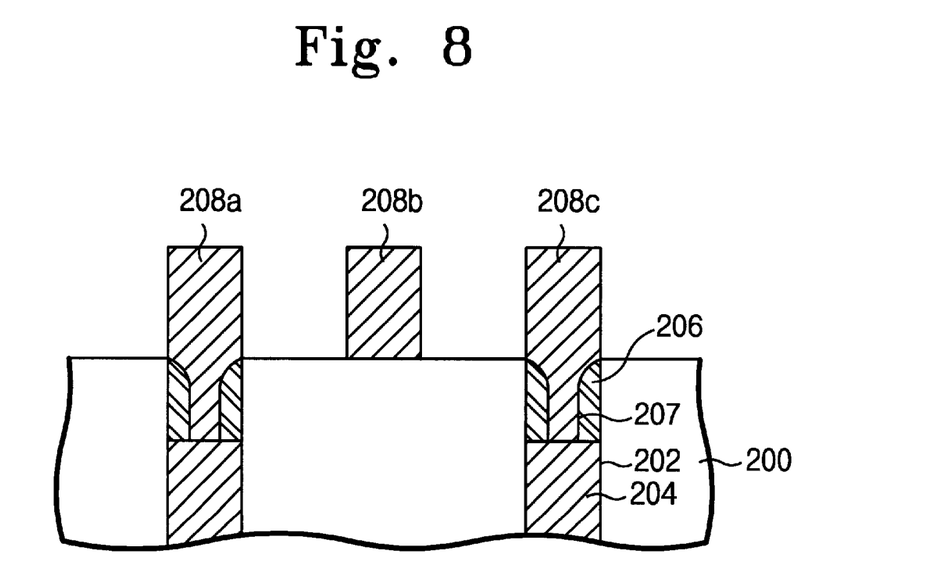
FIG. 8 is a cross-sectional view taken along line B–B' of FIG. 7.

The above-mentioned method for forming a contact structure can also be applied to the formation of a bit line. FIG. 7 schematically shows a top plan view of bit lines and FIG. 8 is a cross-sectional view taken along line B–B' of FIG. 7. Referring to FIG. 7, bit lines 208a–c have a uniform straight line without tap (see reference number 17 of FIG.3). Therefore, spaces between adjacent bit lines can be reduced for higher density device. The formation of bit lines 208a–c will be described with reference to FIG. 8. For simplicity and clarity, same process steps as shown in FIG. 5 will be omitted. After forming the recessed contact plug 204 and sidewall spacer 206, conductive material as for bit line formation is deposited on the resulting structure. Through photolithographic process, the deposited conductive material is then etched to form bit lines 208a–c. As described early, alignment margin between bit lines and contact plug can be increased due to the sidewall spacer. Moreover, sidewall spacer can be easily formed due to the presence of the recessed contact plug that reduces the height of the contact hole.

Figure 9A:
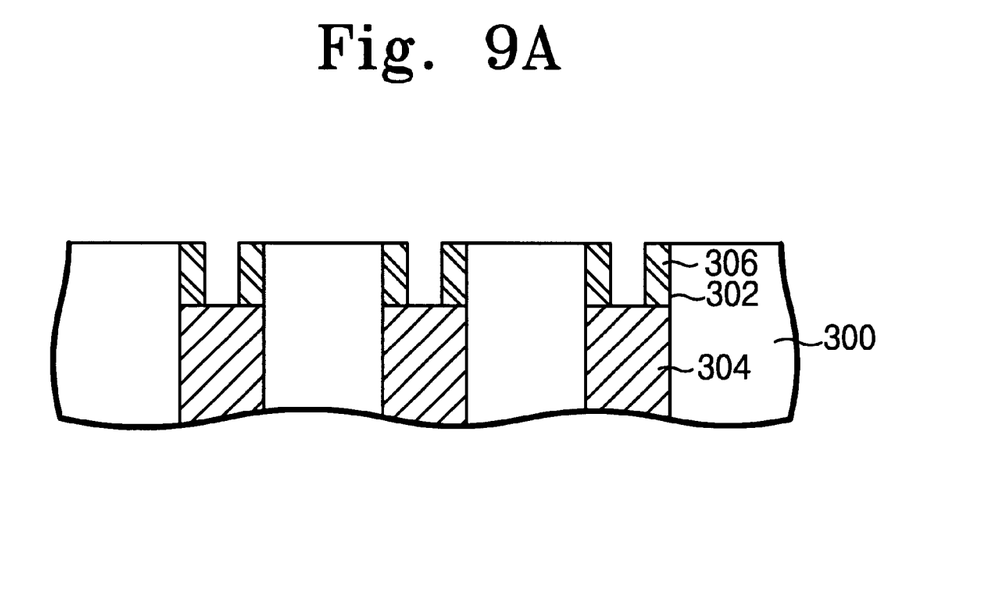
FIGS. 9A and 9B show cross-sectional views of a method for forming a contact, at selected process steps according to a second embodiment of the present invention.
Figure 9B:
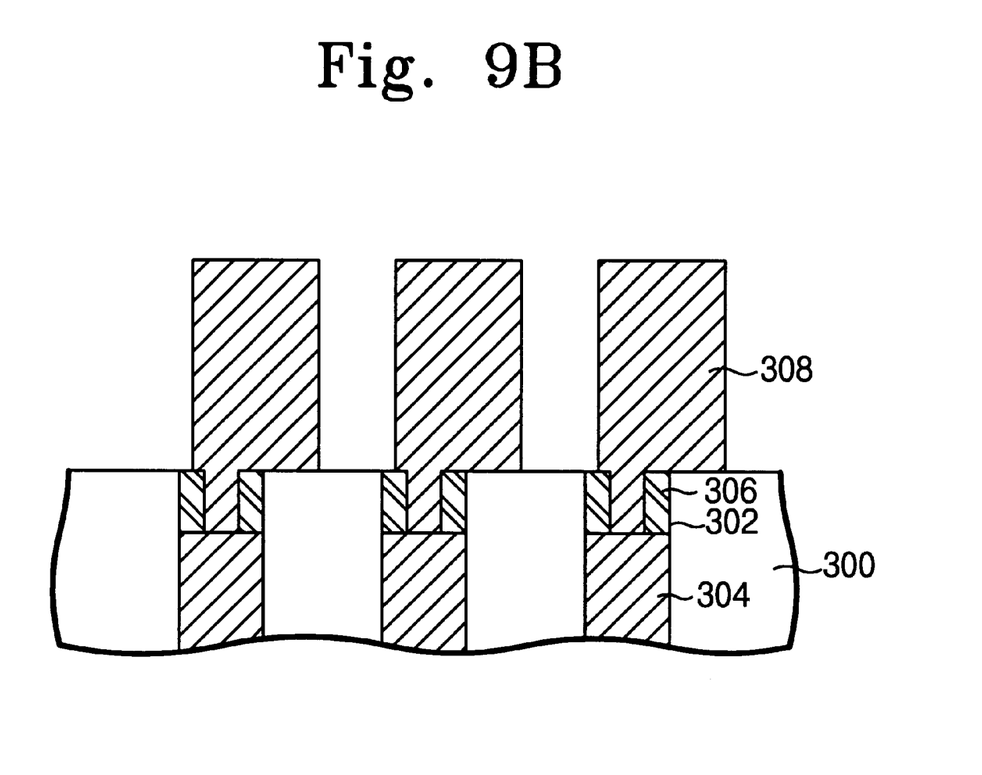

Second embodiment of the present invention will now be described with reference to FIGS. 9A and 9B. The significant difference from the first embodiment is that the sidewall spacer is formed to have uniform thickness from at the top portion to bottom portion as shown in FIG. 9A. Briefly describing, after forming the recessed contact plug 304, a material for spacer formation is deposited in the remainder of contact hole and on the insulating layer 300. Etch back process is carried out and then partial thickness of the insulating layer 300 and material layer is planarized to form the sidewall spacer 306. Subsequently storage node 308 process or bit line process may be performed as like in the first embodiment.

Figure 10A:
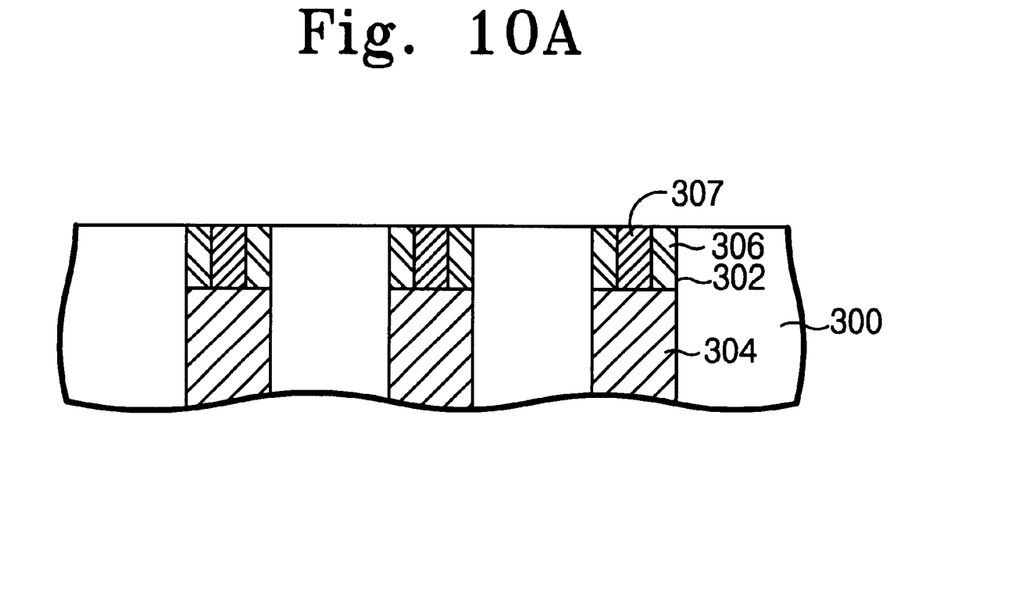
FIGS. 10A and 10B show cross-sectional views of a method for forming a contact, at selected process steps according to a third embodiment of the present invention.
Figure 10B:
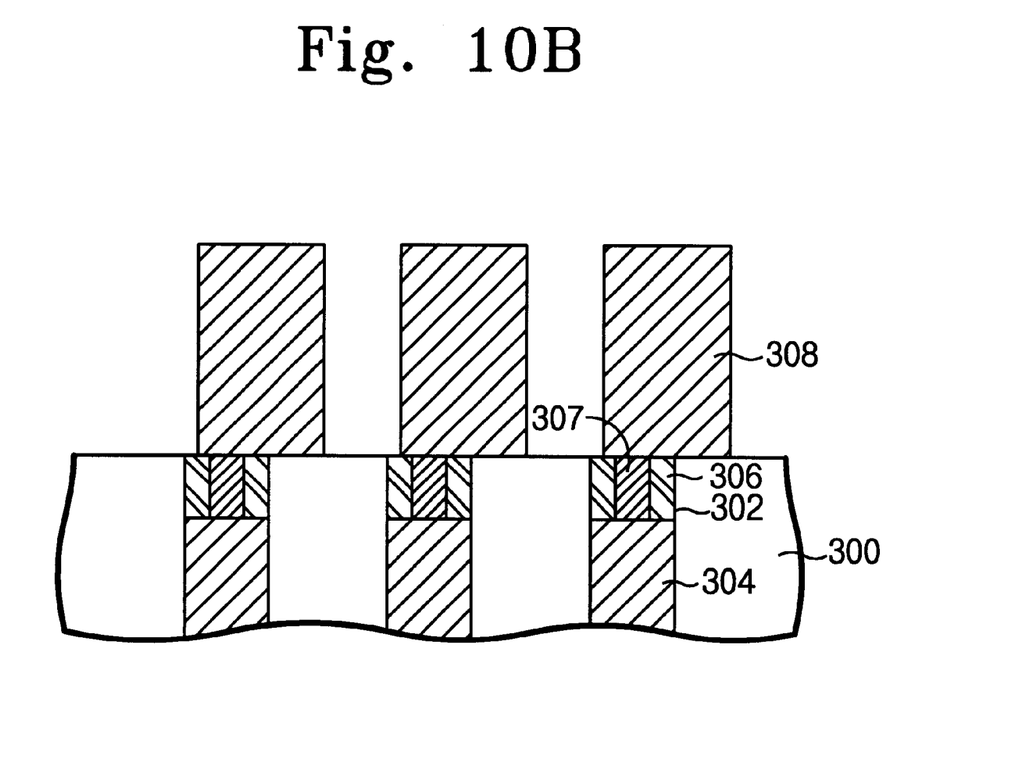

Third embodiment of the present invention will now be described with reference to FIGS. 10A and 10B. In FIGS. 10A and 10B, the same part functioning as shown in FIGS. 9A and 9B are identified same reference numbers and their explanation is omitted.

Referring to FIG. 10A, contact holes 302 are formed in the insulating layer 300. Conductive material is deposited in the contact hole 302 and etched back to form the recessed contact plugs 304. A material as for spacer formation is deposited in the remainder of contact hole 302 and on the insulating layer 300. Etch back process is performed to form sidewall spacer 306 as like in first embodiment. Conductive material is deposited in the remainder of contact hole 302 and on the insulating layer 300. The deposited conductive material, the insulating layer 300 and the sidewall spacer 306 are planarized to form the contact structure as shown in FIG. 10A. Resulting contact structure includes bottom contact plug 304 (i.e., recessed contact plug) and upper contact plug 307 surrounded by sidewall spacer 306 that has uniform thickness.

Next, conductive material as for storage node formation is deposited on resulting structure and patterned to form storage node 308 that is electrically connected to the contact structure. FIG. 10B illustrates reliable storage node even in the misalignment.

What is claimed is:

1. A method of forming a contact between conductors in a semiconductor device comprising:

forming an insulating layer on a semiconductor substrate having a first conductor region;

etching said insulating layer down to said first conductor region to form an opening;

forming a contact plug to be recessed a predetermined depth from a top surface of said insulating layer in said opening;

forming a sidewall spacer on both sidewalls of a remainder of said opening;

forming a conductive layer in said remainder of said opening and on said insulating layer; and patterning said conductive layer to form a second conductor region that is electrically connected to said first conductor region through said contact plug.

2. The method according to claim 1, wherein forming said contact plug comprises depositing a conductive material in said opening and on said insulating layer and etching back said conductive material.

3. The method according to claim 1, wherein said contact plug is made of a material selected from the group consisting of silicon, tungsten, aluminum, titanium, titanium nitride, tungsten nitride, copper, platinum, Au (gold) and Ag (silver).

4. The method according to claim 1, wherein said sidewall spacer is made of a material that has an etching selectivity with respect to said conductive layer.

5. The method according to claim 1, wherein said sidewall spacer is made of at least one material selected from the group consisting of tungsten, titanium, silicon and compounds such as silicon oxide (Si—O), silicon oxynitride (Si—O—N), silicon nitride (Si—N), aluminum oxide (Al—O), aluminum nitride (Al—N), boron nitride (B—N), titanium nitride (Ti—N), tungsten silicide (W—Si) and tungsten nitride (W—N).

6. The method according to claim 1, wherein said forming a sidewall spacer comprises depositing a spacer material layer in said remainder of said opening and on said insulating layer, etching back said spacer material layer.

7. The method according to claim 6, wherein said forming said conductive layer is preceded by completely filling said opening with a conductive material, planarizing said conductive material and a partial thickness of said insulating layer so as to obtain uniform thickness of said sidewall spacer at a top portion and a bottom portion.

8. The method according to claim 1, wherein said forming a sidewall spacer comprises depositing a spacer material layer in said remainder of said opening and on said insulating layer, planarizing said spacer material layer down to said insulating layer.

9. A method for fabricating a semiconductor device comprising:

forming a contact hole in an insulating layer which is formed on a semiconductor substrate;

forming a contact plug to be recessed a predetermined depth from a top surface of said insulating layer in said contact hole;

forming a sidewall spacer on both sidewalls of a remainder of said contact hole; and planarization etching a partial thickness of said insulating layer and said spacer so as to obtain uniform thickness of said sidewall spacer.

10. The method according to claim 9, wherein forming said contact plug comprises depositing a conductive material in said opening and on said insulating layer and etching back said conductive material.

11. The method according to claim 9, wherein said sidewall spacer is made of at least one material selected from the group consisting of tungsten, titanium, silicon and compounds such as silicon oxide (Si—O), silicon oxynitride (Si—O—N), silicon nitride (Si—N), aluminum oxide (Al—O), aluminum nitride (Al—N), boron nitride (B—N), titanium nitride (Ti—N), tungsten silicide (W—Si) and tungsten nitride (W—N).

12. The method according to claim 9, wherein said forming a sidewall spacer comprises depositing a spacer material layer in said remainder of the contact hole and on said insulating layer and etching back said spacer material layer.

13. The method according to claim 9, wherein said forming a sidewall spacer comprises depositing a spacer material layer in said remainder of said contact hole and on said insulating layer, planarizing said spacer material layer down to said insulating layer.

14. The method according to claim 9, further comprising filling said remainder of said contact hole with a conductive material, wherein said planarization etching is carried out by planarization etching said conductive material and a partial thickness of said insulating layer and said spacer.

15. The method according to claim 9, further comprising forming a conductor pattern on said insulating layer to be electrically connected to said recessed contact plug.

* * * * *